United States Patent
Yang et al.

(10) Patent No.: US 10,033,160 B2
(45) Date of Patent: Jul. 24, 2018

(54) INTERBAND CASCADE LIGHT EMITTING DEVICES

(71) Applicants: The Board of Regents of the University of Oklahoma, Norman, OK (US); National Research Council of Canada, Ottawa (CA)

(72) Inventors: Rui Q. Yang, Norman, OK (US); James A. Gupta, Gloucester (CA)

(73) Assignees: The Board of Regents of the University of Oklahoma, Norman, OK (US); National Research Council of Canada, Ottawa (CA)

( * ) Notice: Subject to any disclaimer, the term of this patent is extended or adjusted under 35 U.S.C. 154(b) by 0 days.

(21) Appl. No.: 15/285,099

(22) Filed: Oct. 4, 2016

(65) Prior Publication Data

US 2017/0125979 A1   May 4, 2017

Related U.S. Application Data

(60) Provisional application No. 62/247,571, filed on Oct. 28, 2015.

(51) Int. Cl.
*H01S 5/00* (2006.01)
*H01S 5/34* (2006.01)
(Continued)

(52) U.S. Cl.
CPC .......... *H01S 5/3403* (2013.01); *H01S 5/3401* (2013.01); *H01S 5/183* (2013.01); *H01S 5/3422* (2013.01); *H01S 5/34366* (2013.01)

(58) Field of Classification Search
CPC .. H01S 5/3403; H01S 5/34366; H01S 5/3401; H01S 5/34346; H01S 5/343; H01S 5/183; H01S 5/187; H01S 5/3422
See application file for complete search history.

(56) References Cited

U.S. PATENT DOCUMENTS 5,588,015 A    12/1996  Yang
5,793,787 A *  8/1998  Meyer ............... B82Y 20/00
                                              372/45.01
(Continued)

OTHER PUBLICATIONS

Wagner, J., et al.; "Infrared Semiconductor Lasers for Sensing and Diagnostics"; Applied Physics A; vol. 78; Jan. 14, 2004; 8 pages.
(Continued)

*Primary Examiner* — Yuanda Zhang
(74) *Attorney, Agent, or Firm* — Conley Rose, P.C.; Grant Rodolph; Jonathan K. Polk

(57) ABSTRACT

An interband cascade (IC) light emitting device comprising a plurality of interband cascade stages, wherein at least one of the IC stages is constructed to have an electron injector made of one or more QWs, a type-I quantum well (QW) active region, a barrier layer positioned between the active region and the electron injector, a hole injector made of one or more QWs, and a barrier layer positioned between the active region and the hole injector. In at least one embodiment, a type II heterointerface layer is between the electron injector and an adjacent hole injector. The well layer of the type-I QW active region has compressive strain, while the barrier layers which flank the type-I QW active region comprise tensile strain layers. In certain embodiments, the electron injector and the hole injector comprise tensile strained layers.

20 Claims, 7 Drawing Sheets

(51) Int. Cl.
*H01S 5/183* (2006.01)
*H01S 5/343* (2006.01)

(56) References Cited

U.S. PATENT DOCUMENTS

| | | | | |
|---|---|---|---|---|
| 6,404,791 | B1* | 6/2002 | Yang | B82Y 20/00 372/45.01 |
| 7,286,573 | B1* | 10/2007 | Ning | B82Y 20/00 257/14 |
| 2003/0185267 | A1* | 10/2003 | Hwang | H01S 5/18358 372/96 |
| 2012/0044964 | A1* | 2/2012 | Yang | B82Y 20/00 372/45.01 |
| 2012/0128018 | A1* | 5/2012 | Vurgaftman | B82Y 20/00 372/45.01 |
| 2012/0168816 | A1* | 7/2012 | Sweeney | B82Y 20/00 257/103 |

OTHER PUBLICATIONS

Grau, M., et al.; "Room-Temperature Operation of 3.26 um GaSb-Based Type-I Lasers with Quinternary AlGaInAsSb Barriers"; Applied Physics Letters; vol. 87; Dec. 5, 2005; 4 pages.

Rouillard, Y., et al.; "Quantum Well Lasers Emitting Between 3.0 and 3.4 um for Gas Spectroscopy"; Proc. of SPIE; vol. 8268; 2012; 10 pages.

Shterengas, L., et al.; "Cascade Pumping of GaSb-Based Type-I Quantum Well Diode Lasers"; Proc. of SPIE; vol. 9002; 2014; 10 pages.

Yang, Rui Q.; "Infrared Laser Based on Intersubband Transitions in Quantum Wells"; Superlattices and Microstructures; vol. 17; No. 1; Academic Press Limited; 1995; 7 pages.

Meyer, J.R., et al.; "Type-II and Type-I Interband Cascade Lasers"; Electronics Letters; vol. 32; No. 1; Jan. 4, 1996; 2 pages.

Yang, Rui Q., et al.; "Novel Type-II Quantum Cascade Lasers"; J. Appl. Phys. vol. 79; Issue 11; American Institute of Physics; Jun. 1, 1996; 8 pages.

Vurgaftman, Igor, et al.; "Interband Cascade Lasers With Low Threshold Powers and High Output Powers"; IEEE Journal of Selected Topic in Quantum Electronics; vol. 19; No. 4; Jul./Aug. 2013; 10 pages.

Vurgaftman, I., et al.; "Interband Cascade Lasers"; J. Phys. D: Appl. Phys.; vol. 48; IOP Publishing Ltd.; Mar. 11, 2015; 18 pages.

Belenky, Gregory, et al.; "Type-I Diode Lasers for Spectral Region Above 3 µm"; IEEE Journal of Selected Topics in Quantum Electronics; vol. 17; No. 5; Sep./Oct. 2011; 9 pages.

Vizbaras, Kristijonas, et al.; "Room-Temperature Type-I GaSb-based Lasers in the 3.0-3.7 µm Wavelength Range"; Proc. of SPIE; vol. 8277; 2012; 7 pages.

Gupta, J.A., et al.; "High-Resolution Methane Spectroscopy Using InGaAsSB/AlInGaAsSB Laterally-Coupled Index-Grating Distributed Feedback Laser Diode at 3.23 µm"; Electronics Letters; vol. 48; No. 7; Mar. 29, 2012; 2 pages.

Shterengas, Leon, et al.; "Type-I Quantum Well Cascade Diode Lasers Emitting Near 3 µm"; Applied Physics Letters; vol. 103; AIP Publishing LLC; 2013; 4 pages.

Allerman, A.A., et al.; "InAsSb-based Mid-Infrared Lasers (3.8-3.9 µm) and Light-Emitting Diodes with AiAsSb Claddings and Semimetal Electron Injection, Grown by Metalorganic Chemical Vapor Deposition"; Appl. Phys. Lett.; vol. 69; Issue 4; American Institute of Physics; Jul. 22, 1996; 4 pages.

Kurtz, S.R. et al.; "High Slope Efficiency, "Cascaded" Midinfrared Lasers with Type I InAsSb Quantum Wells"; Applied Physics Letters; vol. 72; No. 17; American Institute of Physics; Apr. 27, 1998; 4 pages.

Jiang, Yuchao, et al.; "Type-I Interband Cascade Lasers Near 3.2 µm"; Applied Physics Letters; vol. 106; AIP Publishing LLC; 2015; 5 pages.

Gupta, J.A., et al.; "Type-I Interband Cascade Lasers Near 3.2 µm"; CLEO: 2015; The Optical Society of America; May 10-15, 2015; 2 pages.

\* cited by examiner

| | | |
|---|---|---|
| GaSb | undoped | 58 Å |
| AlSb/AlAs(2) | undoped | 12 Å |
| GaSb | undoped | 43 Å |
| AlSb/AlAs(2) | undoped | 13 Å |
| GaSb | undoped | 31 Å |
| AlSb/AlAs(2) | undoped | 13 Å |
| $Ga_{0.45}In_{0.55}As_{0.22}Sb_{0.78}$ | undoped | 88 Å |
| AlAs(2)/AlSb/AlAs(3) | undoped | 25 Å |
| InAs | undoped | 22 Å |
| AlSb | undoped | 15 Å |
| InAs  $n/2$  (half layer in $n$) | | 24 Å |
| AlSb | undoped | 14 Å |
| InAs | $n$-doped | 26 Å |
| AlSb | undoped | 14 Å |
| InAs | $n$-doped | 28 Å |
| AlSb | undoped | 13 Å |
| InAs | $n$-doped | 31 Å |
| AlSb | undoped | 13 Å |
| InAs | $n$-doped | 35 Å |
| AlSb | undoped | 12 Å |
| InAs  $n/2$  (half layer in $n$) | | 40 Å |
| AlSb | undoped | 12 Å |
| InAs | undoped | 48 Å |
| AlSb | undoped | 23 Å |

Rows 1–6 bracketed as 22. Rows 7–8 bracketed as 12. Rows 9–24 bracketed as 32. Entire stack bracketed as 102.

GaSb substrate

Growth from bottom to top and from right to left
AlSb/AlAs(2) is that the right is 2Å AlAs

INTERBAND CASCADE LIGHT EMITTING DEVICES

CROSS-REFERENCE TO RELATED APPLICATIONS

The present patent application incorporates by reference the entire provisional patent application identified by U.S. Ser. No. 62/247,571, filed on Oct. 28, 2015, and claims priority thereto under 35 U.S.C. § 119(e).

STATEMENT REGARDING FEDERALLY SPONSORED RESEARCH OR DEVELOPMENT

This invention was made with government support from National Science Foundation grant IIP-1346307. The government has certain rights in the invention.

REFERENCE TO A MICROFICHE APPENDIX

Not applicable.

BACKGROUND

Efficient mid-infrared (mid-IR) semiconductor lasers are needed to meet the growing demands of many civilian and military applications. These applications for mid-IR wavelengths (e.g., $\lambda=2.3$ to 8 to 20 μm (micrometers)) include environmental and chemical-warfare monitoring, medical diagnostics, IR lidar, free-space communications, infrared countermeasures (IRCM), IR illumination, and gas sensing. In recent years, interband cascade (IC) lasers have been advanced to operate in continuous wave (cw) mode at room temperature (RT) and through a wide mid-IR wavelength range from 2.8 μm to 6 μm. The active regions of these IC lasers (referred to herein as "type-II IC lasers") are made of type-II quantum wells (QWs) where electrons and holes are mainly distributed in separate layers such that the wavefunction overlap between the electron and hole states is relatively small. Consequently, optical gain in the type-II QW is relatively weak. Type-I IC lasers based on type-I QW active regions circumvent these issues of type-II IC lasers. In type-I IC lasers, where electrons and holes are mainly distributed in the same layers in the active region so that the optical gain is enhanced, a reduced threshold carrier concentration results, compared to type-II IC lasers. Consequently, free-carrier absorption loss and Auger recombination may also be reduced with a lowered threshold carrier concentration, leading to improvements such as a further drop in threshold current density and increased output power. However, conventional type-I IC lasers suffer from their own shortcomings, and it is the goal of rectifying these shortcomings that the light emitting devices of the present disclosure are directed.

BRIEF DESCRIPTION OF THE DRAWINGS

Several embodiments of the present disclosure are hereby illustrated in the appended drawings. It is to be noted however, that the appended drawings only illustrate several typical embodiments and are therefore not intended to be considered limiting of the scope of the present disclosure. Further, in the appended drawings, like or identical reference numerals or letters may be used to identify common or similar elements and not all such elements may be so numbered. The figures are not necessarily to scale and certain features and certain views of the figures may be shown as exaggerated in scale or in schematic in the interest of clarity and conciseness. For example, thicknesses are not limited to those shown in the drawings.

FIG. 4 is a schematic representation of the layer structure of an IC stage of a particular embodiment of a type-I IC light emitting device of the present disclosure.

DETAILED DESCRIPTION

Figure 1:
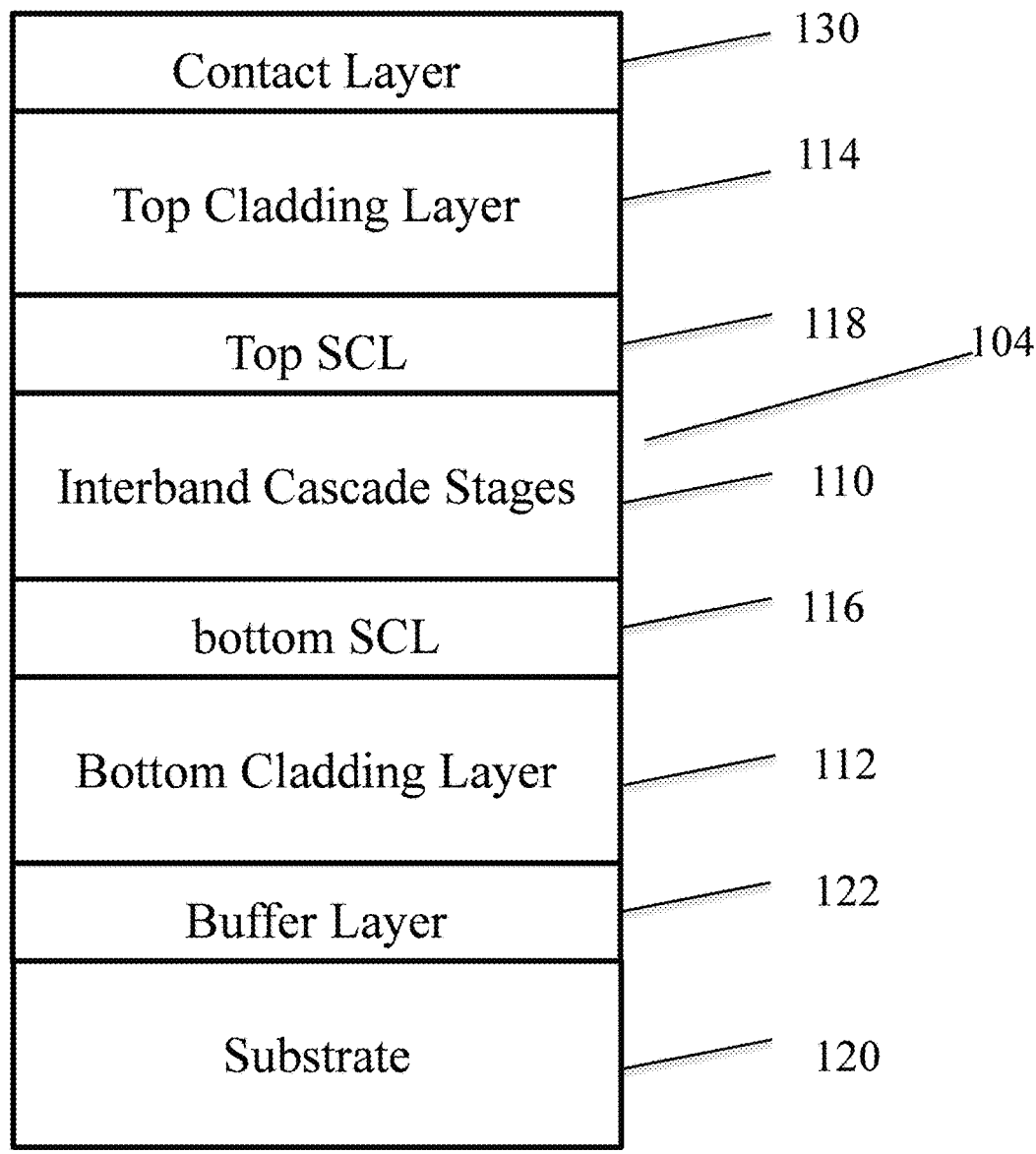
FIG. 1 is a schematic diagram of one embodiment of an IC laser constructed in accordance with the present disclosure.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The present disclosure is directed to, in at least certain embodiments, an IC light emitting device comprising a plurality of IC stages, wherein at least one of the IC stages is constructed to have an electron injector made of one or more (i.e., at least one) quantum wells (QWs) or tensile strained composition graded layers, an active region with at least one type-I QW layer or type-I superlattice layer, a barrier layer positioned between the active region and the electron injector, a hole injector made of one or more (i.e., at least one) QWs or tensile strained composition graded layers, and a barrier layer positioned between the active region and the hole injector. In at least one embodiment, a type II heterointerface layer is located between the electron injector and a hole injector of an adjacent IC stage. The QW layer of the type-I QW active region has compressive strain, while the barrier layers which flank the type-I QW active region comprise tensile strain layers. In at least certain embodiments, the QWs of the electron injector and the hole injector comprise tensile strained layers. In a further difference from conventional type-I mid-IR QW and type-I IC lasers, in at least certain embodiments, the type-I IC QW lasers of the present disclosure use tensile strained semiconductor materials in the barrier layers flanking the active region rather than lattice-matched quinary semiconductor materials.

Before describing various embodiments of the present disclosure in more detail by way of exemplary description, examples, and results, it is to be understood that the present disclosure is not limited in application to the details of methods, compositions, and apparatus as set forth in the following description. The present disclosure is capable of other embodiments or of being practiced or carried out in various ways. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the present disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description.

Unless otherwise defined herein, scientific and technical terms used in connection with embodiments of the present disclosure shall have the meanings that are commonly understood by those having ordinary skill in the art. Further, unless otherwise required by context, singular terms shall include pluralities and plural terms shall include the singular.

All patents, published patent applications, and non-patent publications mentioned in the present disclosure are indicative of the level of skill of those skilled in the art to which the inventive concepts pertain. All patents, published patent applications, and non-patent publications referenced in any portion of this application are herein expressly incorporated by reference in their entirety to the same extent as if each individual patent or publication was specifically and individually indicated to be incorporated by reference.

All of the compositions and methods of production and application thereof disclosed herein can be made and executed without undue experimentation in light of the present disclosure. While the compositions, methods, and apparatus of the present disclosure have been described in terms of particular embodiments, it will be apparent to those of skill in the art that variations may be applied to the compositions, apparatus, and/or methods, and in the steps or in the sequence of steps of the methods described herein without departing from the concept, spirit and scope of the inventive concepts. All such similar substitutes and modifications apparent to those of skilled in the art are deemed to be within the spirit and scope of the inventive concepts as defined herein.

As utilized in accordance with the present disclosure, the following terms, unless otherwise indicated, shall be understood to have the following meanings:

The use of the word "a" or "an," or of the phrase "at least a first," when used in the claims and/or the specification may mean "one," "one or more," "at least one," or "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation or error for the device or the method being employed to determine a value. For example but not by way of limitation, when the term "about" is utilized, the designated value may vary by plus or minus fifteen percent, plus or minus twelve percent, or plus or minus eleven percent, or plus or minus ten percent, or plus or minus nine percent, or plus or minus eight percent, or plus or minus seven percent, or plus or minus six percent, or plus or minus five percent, or plus or minus four percent, or plus or minus three percent, or plus or minus two percent, or plus or minus one percent, or plus or minus one-half percent.

The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more. The term "at least one" may extend up to 500 or 1000 or more, depending on the term to which it is attached; in addition, the quantities of 500/1000 are not to be considered limiting, as higher limits may also produce satisfactory results. In addition, the use of the term "at least one of X, Y and Z" will be understood to include X alone, Y alone, and Z alone, as well as any combination of X, Y and Z. The use of ordinal number terminology (i.e., "first", "second", "third", "fourth", etc.) is solely for the purpose of differentiating between two or more items and is not meant to imply any sequence or order or importance to one item over another or any order of addition, for example.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time. In general, the term "substantially" will be understood to allow for minor variations and/or deviations that do not result in a significant impact thereto.

Where numerical ranges or limitations are expressly stated herein, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k * (R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim or embodiment means that the element is required, or alternatively, the element is not required, both alternatives being within the scope of the claim or embodiment.

Where used herein, the following semiconductor materials may be referred to by the abbreviated names indicated in parentheses: Indium-Arsenic (InAs), Indium-Phosphorus (InP), Silicon (Si), Indium-Arsenic-Antimony (InAsSb), Indium-Gallium-Arsenic (InGaAs), Indium-Gallium-Arsenic-Antimony (InGaAsSb), Gallium-Antimony (GaSb), Gallium-Indium-Antimony (GaInSb), Aluminum-Gallium-Antimony (AlGaSb), Aluminum-Gallium-Indium-Antimony (AlGaInSb), Gallium-Arsenic (GaAs), Gallium-Arsenic-Antimony (GaAsSb), Gallium-Indium-Arsenic-Antimony (GaInAsSb), Gallium-Indium-Arsenic-Bismuth (GaInAsBi), Aluminum-Antimony (AlSb), Aluminum-Arsenic (AlAs), Aluminum-Indium-Antimony (AlInSb), Aluminum-Antimony-Arsenic (AlSbAs), Aluminum-Gallium-Antimony-Arsenic (AlGaSbAs), and Aluminum-Gallium-Indium-Arsenic-Antimony (AlGaInAsSb).

Returning to the description of the several embodiments, as noted above, in a further difference from conventional type-I mid-IR QW and IC lasers, at least certain embodiments of the type-I IC QW lasers of the present disclosure use tensile strained materials such as, but not limited to, AlAsSb in the barrier layers flanking the active region, instead of lattice-matched quinary AlGaInAsSb materials used previously. Because of this, the active region can be constructed using QW material having more compressive strain, leading to additional benefits and without the difficulty inherent in calibrating quinary AlGaInAsSb material during fabrication. As noted, in at least certain embodiments, the presently disclosed IC light emitting devices have one or more IC stages comprising an electron injector and at least one hole injector made of multiple QWs with tensile strain layers. These differ from the structures that were investigated in 1996-1998 for type-I cascade devices with InAsSb/GaAsSb/AlAsSb materials and with lasing only at low temperatures. Further, the presently disclosed type-I IC light emitting devices can be grown by molecular beam epitaxy (MBE), for example, in a way compatible with the growth of type-II IC lasers.

In certain non-limiting embodiments the type-I QW active regions of the present disclosure may be constructed of a well layer comprising at least one of GaInAsSb, GaInAsBi, GaInSbN and GaInAsN. In certain embodiments, the GaInAsSb may have the formula $Ga_xIn_{1-x}As_ySb_{1-y}$ where $0<x\leq 1$ and $0<y\leq 1$, and the GaInAsBi may have the formula $Ga_xIn_{1-x}As_yBi_{1-y}$ where $0<x\leq 1$ and $0<y\leq 1$. The electron injector may be constructed of semiconductor layers selected, for example, from one or more of InAs, InAsSb, InGaAs, InGaAsSb, GaSb, GaInSb, AlGaSb, AlGaInSb, GaAs, AlSb, AlAs, AlInSb, AlSbAs, and AlGaSbAs. The hole injector may be constructed of semiconductor layers selected, for example, from one or more of InAs, InAsSb, InGaAs, InGaAsSb, GaSb, GaInSb, AlGaSb, AlGaInSb, GaAs, AlSb, AlAs, AlInSb, AlSbAs, and AlGaSbAs. In certain non-limiting embodiments, the substrate upon which the plurality of IC stages is grown on is, for example, selected from the group consisting of InAs, InP, GaAs, GaSb, and Si, and metamorphic combinations thereof consisting of a graded or uniform layer of one of said materials (InAs, InP, GaAs, GaSb, and Si) disposed upon another of said materials. In certain non-limiting embodiments, a buffer layer is grown on the substrate before the growth of the IC stages, where the buffer layer can be the same material as the substrate or different from the substrate material. For example, the buffer layer is GaSb, while the substrate can be Si or GaAs. In certain non-limiting embodiments wherein the type-I IC device which include one or more separate confinement layers (SCL), the SCL may be constructed, for example, of GaSb or InAs. In certain non-limiting embodiments which include one or more cladding layers, the cladding layers may be constructed of, for example, an InAs/AlSb superlattice material or AlGaSbAs and a heavily-doped plasmonic InAs layer. In certain non-limiting embodiments which include one or more mirror structures, the one or more mirror structures, such as a bottom mirror structure, may comprise a quarter-wave distributed Bragg reflector constructed of, for example, lattice-matched GaSb/AlSbAs pairs. In at least certain embodiments, the electron injector and the hole injector of the IC stages each comprise multiple QWs which comprise tensile strained layers, i.e. the original lattice constant of the QW layer material ($a_t$) is smaller than the substrate lattice constant $a_o$ (i.e., $a_o>a_t$) or a lattice constant of a buffer layer that serves an equivalent role so that the layer lattice is stretched in the layer plane.

Other embodiments not explicitly described herein which result from combining, integrating, and/or omitting features of the embodiments described herein are also expressly within the scope of the present disclosure as long as they function in accordance with the presently disclosed inventive concepts.

Referring now to the drawings, several non-limiting embodiments included in the present disclosure are shown. FIG. 1 depicts a type-I IC laser 104 constructed to have an IC cascade stage region 110 having multiple IC stages, for example as described more particularly below in regard to FIG. 3 and FIG. 4, and more generally elsewhere herein. At least one IC stage of the IC stage region 110 comprises an electron injector, a type-I QW active region, and a hole injector as described elsewhere herein. The active region of the laser 104 is confined by barrier layers which are free of (i.e., are constructed without using) a lattice-matched quinary AlGaInAsSb semiconductor material. In the embodiment of FIG. 1, as in certain other embodiments disclosed herein, the laser 104 has a bottom separate confinement layer (SCL) 116 and a top SCL 118 which are positioned below and above the IC stage region 110, respectively. Further, in this embodiment, as in certain other embodiments disclosed herein, a bottom cladding layer 112 is positioned below the bottom SCL 116 and a top cladding layer 114 is positioned above the top SCL 118. The whole laser structure from the bottom cladding layer 112 to the top cladding layer 114 can be grown on a substrate 120 upon a buffer layer 122, and may be overlaid with a contact layer 130, as in certain other embodiments disclosed herein.

Figure 2:
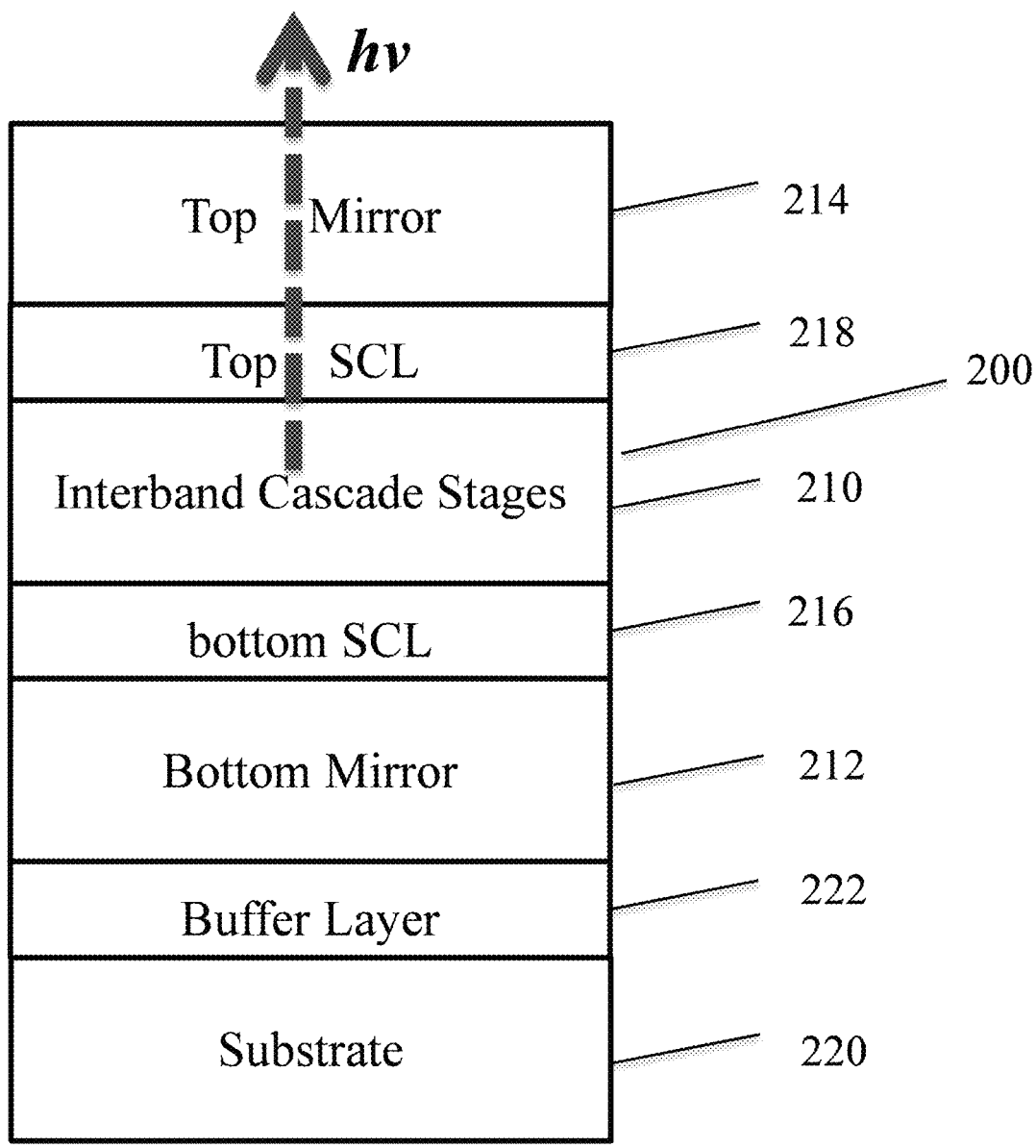
FIG. 2 is a schematic diagram of an IC vertical-cavity surface-emitting laser (VCSEL) constructed in accordance with the present disclosure.

As shown in FIG. 2, at least one non-limiting embodiment of the present disclosure is a VCSEL 200. The VCSEL 200 comprises IC stages 210 with type-I QW active regions such as described elsewhere herein. The IC stages 210 are confined in a vertical cavity comprising the IC stages 210, and a bottom SCL 216 and a top SCL 218. A top mirror 214 is positioned above top SCL 218 and a bottom mirror 212 is positioned below the bottom SCL 216 for achieving an improved beam with other advantages such as single-mode emission and two-dimensional arrays. The VCSEL 200 is grown upon a buffer layer 222 on a substrate 220 as described elsewhere herein. In the VCSEL 200, the laser light which is generated therein is emitted from a top surface as indicated by the dashed arrow in FIG. 2.

The embodiments of the present disclosure having now been generally described, will be more readily understood by reference to the following example and further embodiments, which are included merely for purposes of illustration of certain aspects and embodiments of the inventive concepts, and are not intended to be limiting. The following detailed example of methods of use and construction of the presently disclosed laser devices are to be construed, as noted above, only as illustrative, and not as limitations of the disclosure in any way whatsoever. Those skilled in the art will promptly recognize appropriate variations from the various structures, components, procedures, compositions, and methods.

EXAMPLE

Figure 3:
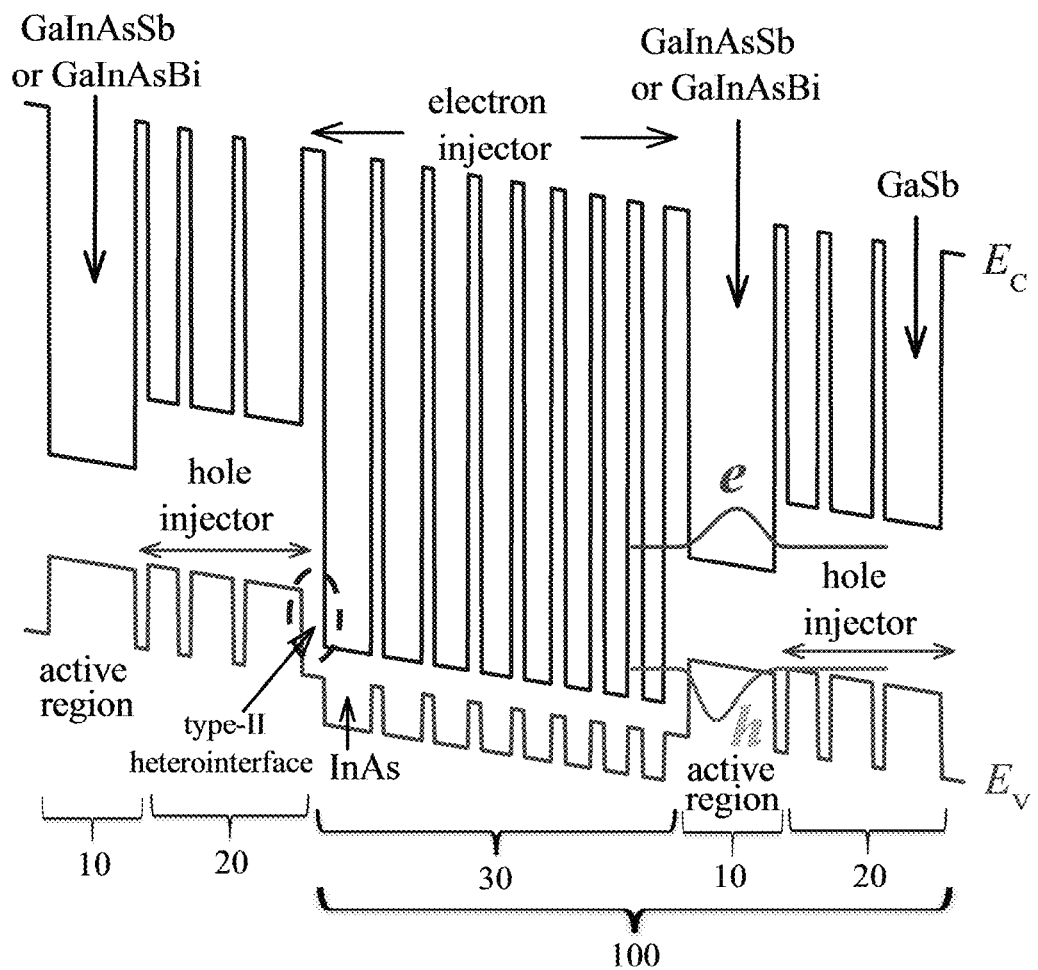
FIG. 3 is a schematic representation of conduction band-edge ($E_c$) and valence band-edge ($E_v$) profiles of one IC stage (electron injector, active region, and hole injector) under an electric field and the layer sequence constructed in accordance with the present disclosure.

In this example, a non-limiting embodiment of a type-I IC laser of the present disclosure is illustrated with demonstrated cw operation at RT. FIG. 3 shows schematic conduction band-edge ($E_c$) and valence band-edge ($E_v$) profiles of an IC light emitting device under a forward bias constructed in accordance with the present disclosure. The IC light emitting device comprises a plurality of IC stages 100 (only one entire IC stage 100 being shown in FIG. 3), where each IC stage 100 comprises an electron injector 30, an active region 10 that operates to emit photons based on interband transitions, and a hole injector 20. The active region 10 comprises a type-I quantum well (QW) where the electron wave-function (e) and hole wave-function (h) are mainly localized in the same well layer so that the optical transition from the electron state to the hole state will produce a large gain for lasing action. A typical QW is made of at least two different semiconductor materials, in which one material (usually with a narrow band-gap) is used as the well layer, while the other material (usually with a wide band-gap) is used as the barrier layer to confine electrons or holes in the well layer. The QW active region well layer is constructed with a compressive strained layer, such as a GaInAsSb layer or a GaInAsBi layer, i.e. the original lattice constant of active region well layer material ($a_c$) is larger than the lattice constant of the substrate ($a_o < a_c$) or a buffer layer that serves an equivalent role so that the well layer lattice is compressed in the layer plane.

The hole injector 20 comprises multiple QWs made of GaSb/(AlSb/AlAs) layers as shown in FIG. 3 (where three QWs are indicated), which comprise tensile strained layers, i.e. the original lattice constant of the layer material ($a_t$) is smaller than the lattice constant of the substrate ($a_o > a_t$) or a buffer layer that serves an equivalent role so that the layer lattice is stretched in the layer plain. Holes are injected from the hole injector 20 to the active region 10. On their boundary, a barrier layer is shared between the hole injector 20 and the active region 10. The barrier layer is thin enough to allow the hole tunneling. The barrier layer comprises a tensile strained material such as, but not limited to, AlSbAs, and in at least certain embodiments is free of a quinary AlGaInAsSb semiconductor material.

The electron injector 30 comprises multiple QWs made of InAs/AlSb(As) layers as shown in FIG. 3 (where eight QWs are indicated), which comprise tensile strained layers, i.e. the original lattice constant of the QW layer material ($a_t$) is smaller than the substrate lattice constant $a_o$ (i.e., $a_o > a_t$) or a lattice constant of a buffer layer that serves an equivalent role so that the layer lattice is stretched in the layer plane. Electrons are injected from the electron injector 30 to the active region 10 in a direction opposite to the direction from the hole injector 20. On their boundary, a barrier layer is shared between the electron injector 30 and the active region 10, the barrier layer is thin enough to allow the electron tunneling. The barrier layer comprises a tensile strained material such as, but not limited to, AlSbAs, and in at least certain embodiments is free of a quinary AlGaInAsSb semiconductor material. The electron injector 30 is coupled through a type-II heterointerface (indicated by a dashed oval in FIG. 3) to the hole injector 20 in the next adjacent IC stage, where the type-II heterointerface facilitates the interband tunneling, i.e. the spatial tunneling of electrons from the conduction band in one location to the valence band in another location, and vice versa. In at least certain embodiments, the type-II heterointerface comprises two semiconductor material layers in which the conduction and valence band-edges of one material is lower in energy than the conduction and valence band-edges of the other material, respectively, so that interband tunneling is allowed and a tunneling current can be formed under a bias voltage. An example of the type-II heterointerface is GaSb/InAs, in which a very thin AlSb layer can be inserted between GaSb and InAs as illustrated in FIG. 3.

The layers with compressive strain and tensile strain are designed to balance each other so that the net stress in each IC stage is minimized. The large compressive strain in the active region well layer 10 is preferred for improving lasing action and adjusting the photon emission wavelengths. On the other hand, the tensile strain is introduced in the electron injectors 30 and hole injectors 20 for manipulating carrier confinements and achieving better material crystal quality.

FIG. 4 shows the schematic embodiment of a detailed layer structure of one IC stage that is included in an IC light emitting device grown on a GaSb substrate in accordance with the present disclosure. As shown, the stage 102 comprises an electron injector 32, an active region 12 that operates to emit photons, and a hole injector 22. The QW active region 12 has, in this non-limiting embodiment, an 8.8-nanometer (nm)-thick compressive strained $Ga_{0.45}In_{0.55}As_{0.22}Sb_{0.78}$ well layer. The electron injector 32 comprises 8 digitally graded InAs/AlSb QWs, while the hole injector 22 comprises 3 digitally graded GaSb/(AlSb/AlAs) QWs. The barrier layers between the active region 12 and the hole injector 22 and electron injector 32 comprise, in this embodiment, tensile strained AlAs layers which are both free of a quinary AlGaInAsSb semiconductor material. Although specific compositions, thicknesses, numbers, and arrangements of the QW and barrier layers are indicated in the embodiment represented in FIG. 4, it is to be understood that the various embodiments of the present disclosure are not to be limited to the indicated specific compositions, thicknesses, numbers, and arrangements of the QW and barrier layers.

In addition to digitally graded QWs, tensile strained composition graded layers can be used for the electron injector and/or hole injectors in place of the QWs. In one non-limiting example, the tensile strained composition graded $Al_xGa_{1-x}Sb$ layer, where x is the fraction of Al and is adjusted continuously in real space, in a manner known to a person having ordinary skill in the art, so that the band-gap of $Al_xGa_{1-x}Sb$ layer varies spatially, can be used for the hole injector. In another non-limiting example, a composition graded $Al_xIn_{1-x}AsSb$, adequately adjusted in a manner known to a person having ordinary skill in the art, can be used for the electron injector.

For the IC light emitting devices of the present disclosure, the active region in each cascade stage can also comprise multiple type-I QWs, or a finite type-I superlattice. The superlattice is a periodic arrangement of at least two alternative layers made of different semiconductor materials, in which one material is used as the well layer with a narrow band-gap and the other material is used as the barrier layer with a wide band-gap. In a superlattice, well layers are coupled relatively strongly compared to multiple QWs with relatively thick barrier layers. An example of the type-I superlattice is InGaAsSb/AlSbAs, in which InGaAsSb layer is 9-nm-thick and AlSbAs layer is 1.2-nm-thick.

A particular, non-limiting, embodiment of an IC device of the present disclosure is an IC laser structure having, for example, 6 substantially identical IC stages, such as the IC stage 102 represented in FIG. 4. The IC structure represented in FIG. 4 was grown on an n-type GaSb substrate in a V90 molecular beam epitaxy (MBE) system using As and Sb valved cracker cells and conventional group-III and dopant effusion cells. The InAs layers of the central 4 QWs in the electron injector of each cascade stage were doped with Si to $2.3\times10^{18}$ inverse cubic centimeters ($cm^{-3}$). The 6 cascade stages as a whole are sandwiched by two 200-nm-thick GaSb separate confinement layers (SCLs) with two InAs/AlSb superlattice (SL) cladding layers on the top and the bottom of the SCLs. The grown wafer was processed into deep-etched broad-area (150-μm and 100-μm-wide) mesa stripe and narrow-ridge (10-μm-wide, 12-μm-wide, 15-μm-wide, 20-μm-wide) lasers by contact photolithography and wet chemical etching. The processed wafer was cleaved into laser bars with lengths from 1.5 to 2.0 millimeters (mm) and the facets were left uncoated. The laser bars were mounted epilayer side up on copper heat sinks with indium solder and placed on the cold finger of a cryostat for measurements in cw and pulsed modes. In pulsed measurements, the applied current pulse width was 1 μs at a repetition rate of 5 kilohertz (kHz).

Figure 5:
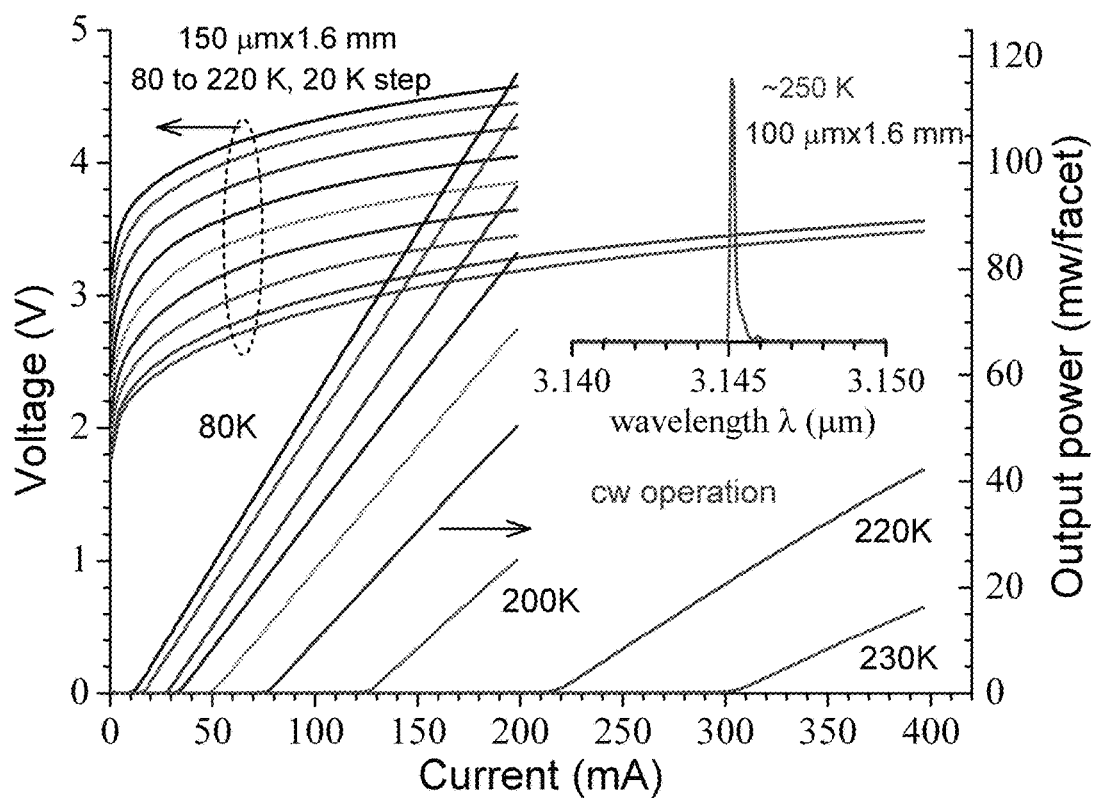
FIG. 5 is a graphical representation of the current-voltage-light characteristics for a 150-μm-wide type-I IC laser device (in cw operation) constructed in accordance with the present disclosure, for example as shown in FIG. 3 and FIG. 4. The inset graph is cw lasing spectrum from a 100-μm-wide device at a heat-sink temperature of about 250 K.
Figure 6:
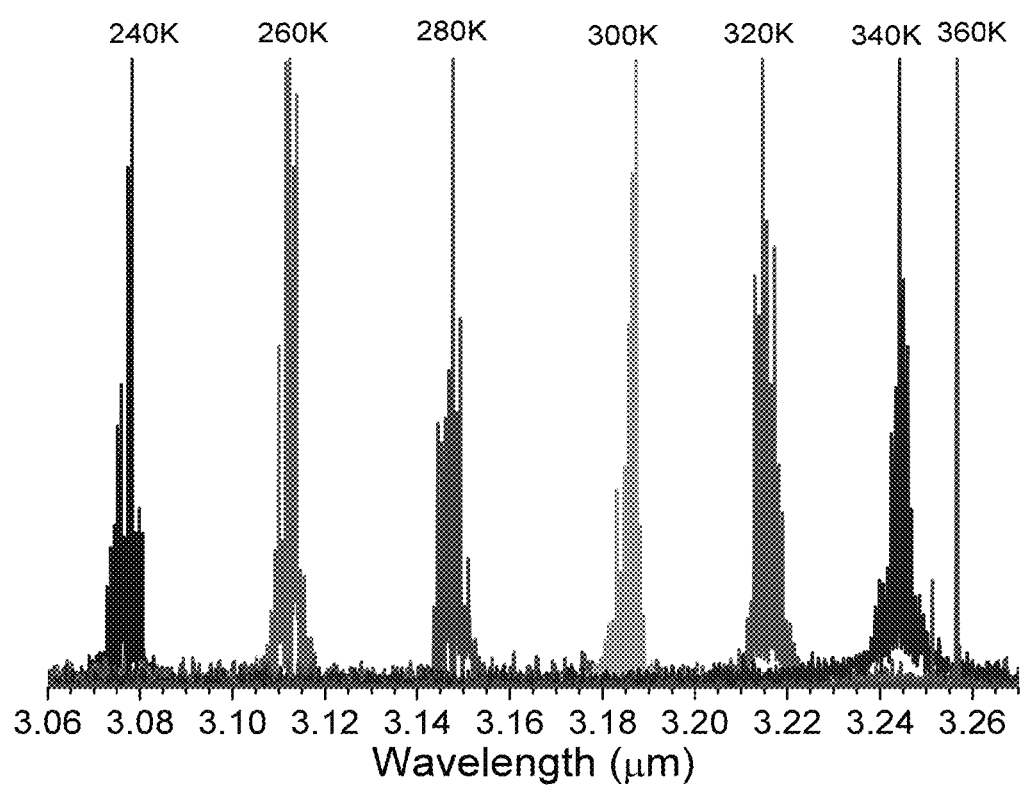
FIG. 6 is a graphical representation of pulsed lasing spectra near the threshold (360 Kelvin (K) spectrum from a 100-μm-wide device, the rest from a 150-μm-wide device) for a type-I IC laser device, for example as depicted in FIG. 3 and FIG. 4.

Broad-area devices made from the wafer constructed to have a structure such as shown in FIG. 4 or as described elsewhere herein in accordance with the present disclosure could lase in cw mode at heat sink temperature (T) up to about 250 K at a wavelength of 3.15 μm, for example as shown in FIG. 5. Current-Voltage-Light (I-V-L) characteristics are also shown in FIG. 5 for a 150-μm-wide device in cw operation. At 80 K, the lasing wavelength was 2.81 μm with a threshold voltage of 3.66 volts (V) and threshold current density of 4.3 amperes per squared centimeters ($A/cm^2$), and the cw output power was about 120 milliwatts (mW)/facet at a current of 200 milliamps (mA) with a slope of 0.63 watts/amp (W/A). This implied an external quantum efficiency of 2.86 and confirmed the efficient cascade action. The actual output power and external quantum efficiency may be somewhat higher than the above reported values because the measurement system calibration included corrections for the window transmission loss without accounting for beam divergence. In pulsed conditions, these broad-area devices could lase at temperatures up to 360 K with a lasing wavelength near 3.25 μm as shown in FIG. 6. The lasing wavelength red shifted with the heat-sink temperature at a rate of 1.8 nm/K from about 3.08 μm at 240 K. At 300 K, the threshold current density was as low as 310 $A/cm^2$ with a threshold voltage of about 3.5 V. This translates to a threshold input power density of below 1.1 $kW/cm^2$, which would allow cw operation of narrow-ridge devices at RT.

Figure 7:
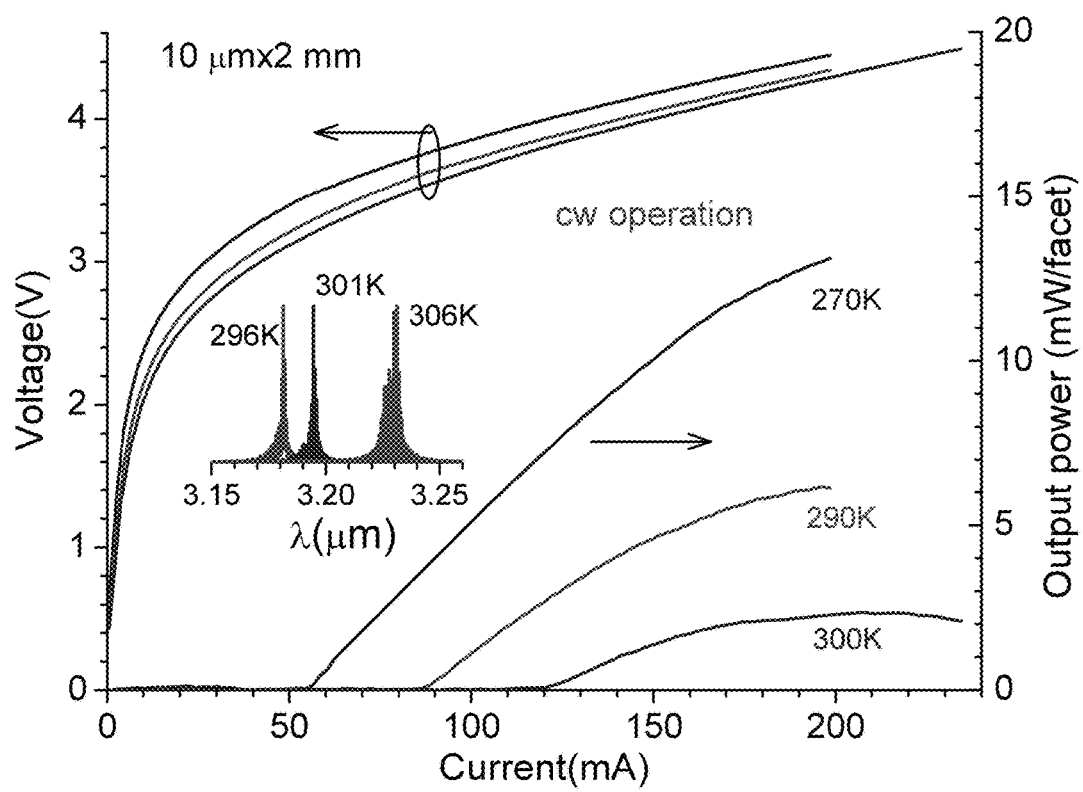
FIG. 7 is a graphical representation of the current-voltage-light characteristics for a 10-μm-wide device (in cw operation) of a type-I IC laser device, for example as depicted in FIG. 3 and FIG. 4 constructed in accordance with the present disclosure. The inset is its cw lasing spectrum at a heat-sink temperature of about 296 to 306 K.

Narrow-ridge devices with about 4-μm-thick electroplated gold layer on the top were able to lase in cw mode at temperatures up to 306 K at 3.23 μm as shown in FIG. 7. The cw current-voltage-light (I-V-L) characteristics of a 10-μm-wide and 2-mm-long device at several heat-sink temperatures are also shown in FIG. 7. The Joule heating in the laser was substantial at 300 K as reflected by the thermal rollover in FIG. 7. Nevertheless, the detected output power exceeded 2 mW/facet at 300 K without accounting for beam divergence loss. The input power at threshold was slightly less than 0.46 W at 300K.

As demonstrated herein, a new type of edge-emitting IC laser based on IC stages comprising type-I QW active regions with both pulsed and cw operation above RT has been developed without using commonly adopted lattice-matched quinary AlGaInAsSb barrier layers. Thus, efficient semiconductor mid-IR lasers can be constructed without facing the difficult task of carefully calibrating quinary AlGaInAsSb material as barrier layers. In certain embodiments, the disclosed IC stages with type-I QW active regions can be configured with top and bottom mirror structures as a VCSEL for achieving improved beam with other advantages such as single-mode emission and two-dimensional arrays.

While several embodiments of the present disclosure have been provided herein, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A semiconductor light emitting device comprising:
   a plurality of interband cascade (IC) stages, wherein each IC stage comprises:
      an electron injector comprising a first quantum well and a first barrier layer, wherein the first barrier layer comprises a first tensile-strained semiconductor material free of a quinary aluminum gallium indium arsenic antimony (AlGaInAsSb) semiconductor material;
      a first hole injector comprising a second quantum well and a second barrier layer, wherein the second barrier layer comprises a second tensile-strained semiconductor material free of a quinary AlGaInAsSb semiconductor material; and an active region positioned between the first barrier layer and the second barrier layer and comprising a type-I quantum well,
  wherein the type-I quantum well comprises a well layer having compressive strain and is configured to emit photons based on interband transitions, and
  wherein the electron injector is coupled to a second hole injector of an adjacent IC stage through a type-II heterointerface;
a top mirror structure; and
a bottom mirror structure comprising a quarter-wave distributed Bragg reflector comprising lattice-matched gallium antimony/aluminum antimony arsenic (GaSb/AlSbAs) pairs,
  wherein the semiconductor light emitting device is a vertical-cavity surface-emitting laser (VCSEL).

2. The semiconductor light emitting device of claim 1, wherein the well layer comprises gallium indium arsenic antimony (GaInAsSb).

3. The semiconductor light emitting device of claim 2, wherein the GaInAsSb has the formula $Ga_xIn_{1-x}As_ySb_{1-y}$, and wherein $0<x\leq1$ and $0<y\leq1$.

4. The semiconductor light emitting device of claim 1, wherein the well layer comprises gallium indium arsenic bismuth (GaInAsBi).

5. The semiconductor light emitting device of claim 4, wherein the GaInAsBi has the formula $Ga_xIn_{1-x}As_yBi_{1-y}$, and wherein $0<x\leq1$ and $0<y\leq1$.

6. The semiconductor light emitting device of claim 1, wherein the first quantum well and/or the first barrier layer of the electron injector comprises a semiconductor layer selected from the group consisting of indium arsenic (InAs), indium arsenic antimony (InAsSb), indium gallium arsenic (InGaAs), indium gallium arsenic antimony (InGaAsSb), gallium antimony (GaSb), gallium indium antimony (GaInSb), aluminum gallium antimony (AlGaSb), aluminum gallium indium antimony (AlGaInSb), gallium arsenic (GaAs), aluminum antimony (AlSb), aluminum arsenic (AlAs), aluminum indium antimony (AlInSb), aluminum antimony arsenic (AlSbAs), and aluminum gallium antimony arsenic (AlGaSbAs), and combinations thereof.

7. The semiconductor light emitting device of claim 1, wherein the second quantum well and/or the second barrier layer of the first hole injector comprises at least one semiconductor layer selected from the group consisting of InAs, InAsSb, InGaAs, InGaAsSb, GaSb, GaInSb, AlGaSb, AlGaInSb, GaAs, AlSb, AlAs, AlInSb, AlSbAs, and AlGaSbAs, and combinations thereof.

8. The semiconductor light emitting device of claim 1, further comprising a substrate coupled to the plurality of IC stages, wherein the substrate is selected from the group of materials consisting of indium arsenic (InAs), indium phosphorous (InP), gallium arsenic (GaAs), gallium antimony (GaSb), silicon (Si), and metamorphic combinations thereof consisting of a graded or uniform layer of one of the materials disposed upon another of the materials.

9. The semiconductor light emitting device of claim 1, further comprising two confinement layers (SCLs) and two cladding layers, wherein the semiconductor light emitting device is a laser device.

10. The semiconductor light emitting device of claim 9, wherein the SCLs comprise gallium antimony (GaSb).

11. The semiconductor light emitting device of claim 9, wherein the SCLs comprise indium arsenic (InAs).

12. The semiconductor light emitting device of claim 9, wherein the cladding layers comprise an indium arsenic/aluminum antimony (InAs/AlSb) superlattice.

13. The semiconductor light emitting device of claim 9, wherein the cladding layers comprise aluminum gallium arsenic antimony (AlGaAsSb).

14. The semiconductor light emitting device of claim 13, wherein the cladding layers further comprise heavily-doped indium arsenic (InAs).

15. The semiconductor light emitting device of claim 1, wherein the active region comprises at least one additional type-I quantum well.

16. The semiconductor light emitting device of claim 1, wherein the semiconductor light emitting device is configured to operate in a continuous wave mode at room temperature and/or is configured to lase at a temperature in a range of 300 Kelvin (K) to 360 K.

17. A semiconductor light emitting device comprising:
a plurality of interband cascade (IC) stages, wherein each IC stage comprises:
  an electron injector comprising a first quantum well and a first barrier layer, wherein the first barrier layer comprises a first tensile-strained semiconductor material free of a quinary aluminum gallium indium arsenic antimony (AlGaInAsSb) semiconductor material;
  a first hole injector comprising a second quantum well and a second barrier layer, wherein the second barrier layer comprises a second tensile-strained semiconductor material free of a quinary AlGaInAsSb semiconductor material; and
  an active region positioned between the first barrier layer and the second barrier layer and comprising a type-I superlattice well layer,
  wherein the type-I superlattice well layer has compressive strain and is configured to emit photons based on interband transitions, and
  wherein the electron injector is coupled to a second hole injector of an adjacent IC stage through a type-II heterointerface;
a top mirror structure; and
a bottom mirror structure comprising a quarter-wave distributed Bragg reflector comprising lattice-matched gallium antimony/aluminum antimony arsenic (GaSb/AlSbAs) pairs,
wherein the semiconductor light emitting device is a vertical-cavity surface-emitting laser (VCSEL).

18. A semiconductor light emitting device comprising:
a plurality of interband cascade (IC) stages, wherein each IC stage comprises:
  an electron injector comprising a tensile-strained composition graded layer and a first barrier layer, wherein the first barrier layer comprises a first tensile-strained semiconductor material free of a quinary aluminum gallium indium arsenic antimony (AlGaInAsSb) semiconductor material;
  a first hole injector comprising at least one quantum well and a second barrier layer, wherein the second barrier layer comprises a second tensile-strained semiconductor material free of a quinary AlGaInAsSb semiconductor material; and
  an active region positioned between the first barrier layer and the second barrier layer and comprising a type-I quantum well,
  wherein the type-I quantum well comprises a well layer having compressive strain and is configured to emit photons based on interband transitions, and
  wherein the electron injector is coupled to a second hole injector of an adjacent IC stage through a type-II heterointerface;

a top mirror structure; and
a bottom mirror structure comprising a quarter-wave distributed Bragg reflector comprising lattice-matched gallium antimony/aluminum antimony arsenic (GaSb/AlSbAs) pairs,
wherein the semiconductor light emitting device is a vertical-cavity surface-emitting laser (VCSEL).

19. A semiconductor light emitting device comprising:
a plurality of interband cascade (IC) stages, wherein each IC stage comprises:
  an electron injector comprising a first quantum well and a first barrier layer, wherein the first barrier layer comprises a first tensile-strained semiconductor material free of a quinary aluminum gallium indium arsenic antimony (AlGaInAsSb) semiconductor material;
  a first hole injector comprising a tensile-strained composition graded layer and a second barrier layer, wherein the second barrier layer comprises a second tensile-strained semiconductor material free of a quinary AlGaInAsSb semiconductor material; and
  an active region positioned between the first barrier layer and the second barrier layer and comprising a type-I quantum well,
  wherein the type-I quantum well comprises a well layer having compressive strain and is configured to emit photons based on interband transitions, and
  wherein the electron injector is coupled to a second hole injector of an adjacent IC stage through a type-II heterointerface;
a top mirror structure; and
a bottom mirror structure comprising a quarter-wave distributed Bragg reflector comprising lattice-matched gallium antimony/aluminum antimony arsenic (GaSb/AlSbAs) pairs,
wherein the semiconductor light emitting device is a vertical-cavity surface-emitting laser (VCSEL).

20. A semiconductor light emitting device comprising:
a plurality of interband cascade (IC) stages, wherein each IC stage comprises:
  an electron injector comprising a first tensile-strained composition graded layer and a first barrier layer, wherein the first barrier layer comprises a first tensile-strained semiconductor material free of a quinary aluminum gallium indium arsenic antimony (AlGaInAsSb) semiconductor material;
  a first hole injector comprising a second tensile-strained composition graded layer and a second barrier layer, wherein the second barrier layer comprises a second tensile-strained semiconductor material free of a quinary AlGaInAsSb semiconductor material; and
  an active region positioned between the first barrier layer and the second barrier layer and comprising a type-I quantum well,
  wherein the type-I quantum well comprises a well layer having compressive strain and is configured to emit photons based on interband transitions, and
  wherein the electron injector is coupled to a second hole injector of an adjacent IC stage through a type-II heterointerface;
a top mirror structure; and
a bottom mirror structure comprising a quarter-wave distributed Bragg reflector comprising lattice-matched gallium antimony/aluminum antimony arsenic (GaSb/AlSbAs) pairs,
wherein the semiconductor light emitting device is a vertical-cavity surface-emitting laser (VCSEL).

* * * * *